(12) United States Patent
Gisler

(10) Patent No.: US 7,641,379 B2
(45) Date of Patent: Jan. 5, 2010

(54) PRESS FIT ELECTRONIC COMPONENT

(75) Inventor: Gregory Joseph Gisler, Los Gatos, CA (US)

(73) Assignee: Cisco Technology, Inc., San Jose, CA (US)

( * ) Notice: Subject to any disclaimer, the term of this patent is extended or adjusted under 35 U.S.C. 154(b) by 232 days.

(21) Appl. No.: 11/751,520

(22) Filed: May 21, 2007

(65) Prior Publication Data

US 2008/0293270 A1 Nov. 27, 2008

(51) Int. Cl.
*H01R 33/00* (2006.01)
*H05K 7/02* (2006.01)

(52) U.S. Cl. ............... 362/652; 362/640; 362/800; 361/807

(58) Field of Classification Search ........... 362/640, 362/652, 800; 361/806–807, 813; 439/91
See application file for complete search history.

(56) References Cited

U.S. PATENT DOCUMENTS 5,096,425 A * 3/1992 Takahashi .................. 439/55

2006/0035410 A1 * 2/2006 Shiffer ..................... 438/111

FOREIGN PATENT DOCUMENTS

JP 2001-44507 * 2/2001

OTHER PUBLICATIONS

Product Brochure [online]. Khatod Optoelectronic [retrieved on May 22, 2007]. Retrieved from the Internet: <URL: http://www.khatod.com/pdf/k35.pdf>, 32 p.

* cited by examiner

*Primary Examiner*—Ali Alavi
(74) *Attorney, Agent, or Firm*—Schwegman, Lundberg & Woessner, P.A.

(57) ABSTRACT

Disclosed is a press fit electronic component for a light emitter. The electronic component comprises at least one light emitter and at least one connection lead in electrical communication with the light emitter, the lead being configured for forming a frictional fit with a corresponding hole, the lead further being sufficiently rigid to withstand a compressive insertion force into the hole.

19 Claims, 6 Drawing Sheets

PRESS FIT ELECTRONIC COMPONENT

FIELD

This application relates to an electronic component for emitting light.

BACKGROUND

Electrical or electronic apparatus, such as network switches or routers, often include a plurality of ports or sockets to receive cables, such as network cables. High port-count server switches attempt to have as many ports as possible on a front panel to maximize functionality. The front panel is most easily accessible to a user, but space on the front cover is often limited. A printed circuit board (PCB), on which the ports are mounted, dictates the number of ports which will fit in any given space.

Further, an indication is usually provided of the status of each of the ports. Such an indication may be provided by a light source or light emitter, such as a light emitting diode (LED). Since it is useful to have a LED for each port, the available space on the PCB becomes even more limited. The LEDs may even compete for space with ports and other devices on the front panel of a server.

Typical right angled LEDs (having their leads orientated transversely to the LED) are too wide to fit, leaving only the narrowest LED to be considered. In general, right angled LEDs have leads or metal pins which fit into plated holes on the PCB and require wave soldering to complete the electrical connection and physical attachment of the LED to the PCB. Once soldered, LEDs can only be removed by de-soldering them. LEDs with solder pins are often misaligned during the wave soldering process and therefore may not line up with apertures provided on the front panel. The soldering process itself requires specific pin lengths and component orientation to minimize soldering defects. Also, LEDs with solder pins require the additional cost to wave solder, as most PCBs use components that are surface mount devices which have no pins and use a re-flow solder process.

Surface mount right angled LEDs are available. The surface mount process can also cause the LEDs to "float" and become misaligned during soldering. Removal of surface mounted LEDs requires the difficult task of de-soldering.

BRIEF DESCRIPTION OF DRAWINGS

Example embodiments are illustrated by way of example and not limitation in the figures of the accompanying drawings, in which like references indicate similar elements and in which.

DETAILED DESCRIPTION OF EXAMPLE EMBODIMENTS

Figure 1:
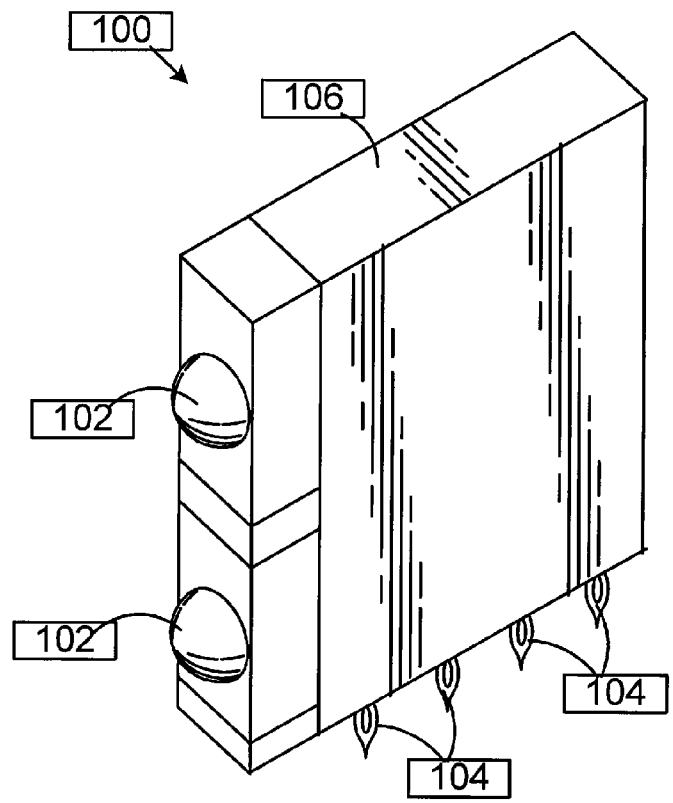
FIG. 1 shows a three-dimensional view of an electronic component in accordance with an example embodiment.
Figure 2:
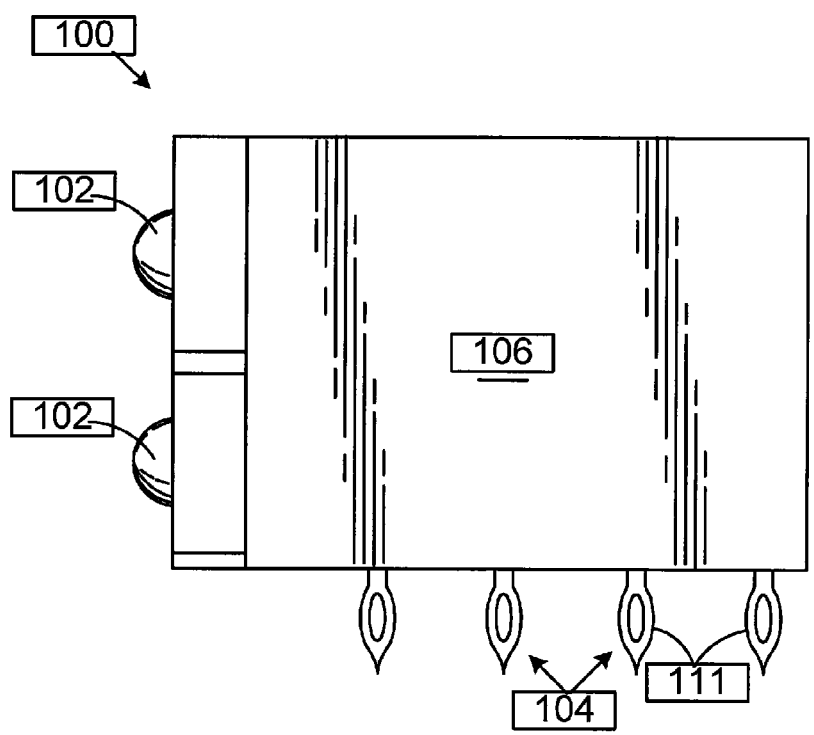
FIG. 2 shows a side elevational view of the electronic component of FIG. 1.

In the following description, for purposes of explanation, numerous specific details are set forth in order to provide a thorough understanding of one or more example embodiments. It will be evident, however, to one skilled in the art that the example embodiments may be practiced without these specific details.

Overview

The electronic component is described that comprises at least one light emitter and at least one connection lead in electrical communication with the light emitter, the lead being configured for forming a frictional fit with a corresponding hole, the lead further being sufficiently rigid to withstand a compressive insertion force into the hole.

DETAILED DESCRIPTION OF THE DRAWINGS

Referring to FIGS. 1 to 4, reference numeral 100 generally indicates an electronic component, in accordance with an example embodiment, comprising at least one light emitter. In the example embodiment illustrated, the electronic component 100 comprises two light emitters in the form of LEDs 102. The electronic component 100 further comprises four leads, generally indicated by reference numeral 104, two leads for each LED 102. The leads 104 each comprise an internal portion 110 and an exposed connection portion or end 111. Internal portions 110 are connected to respective LEDs 102 (refer to FIG. 3) and the exposed connection portions 111 provide positive and negative connection terminals by which the LEDs 102 may be powered. The leads 104 are generally L-shaped and the electronic component 100 is therefore a right angled connector. In the example right angled LEDs 102 the exposed connection end 111 and the light emitter 102 are orientated transversely to each other to define a right angle electronic component.

Example embodiments will be further described with reference to the right angled electronic component 100, although it is to be understood that teaching of the specification could also be applied to vertically mounted electronic components or other types of electronic components. The LEDs 102 may be round (as illustrated), rectangular, or any other desired shape.

Figure 3:
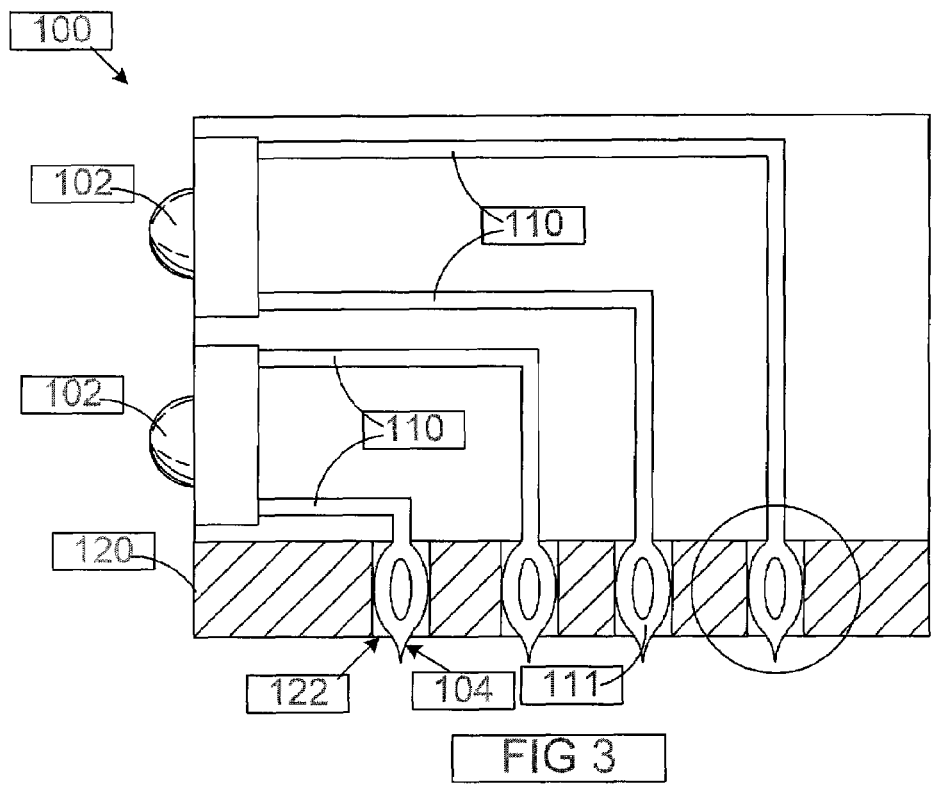
FIG. 3 shows a longitudinal cross-sectional view of the electronic component of FIG. 1.
Figure 4:
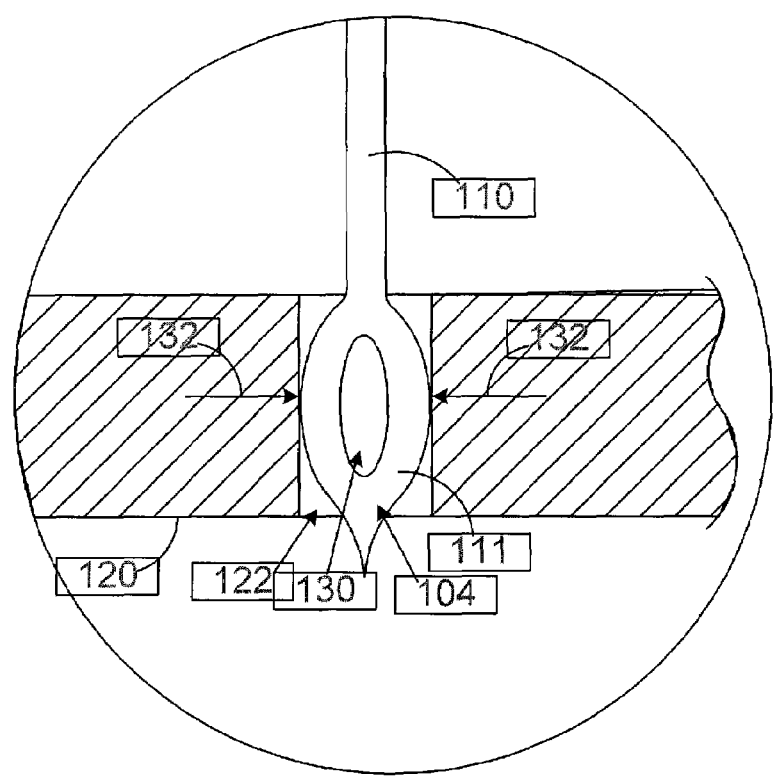
FIG. 4 shows an exploded view of a portion of the electronic component of FIG. 3.
Figure 5:
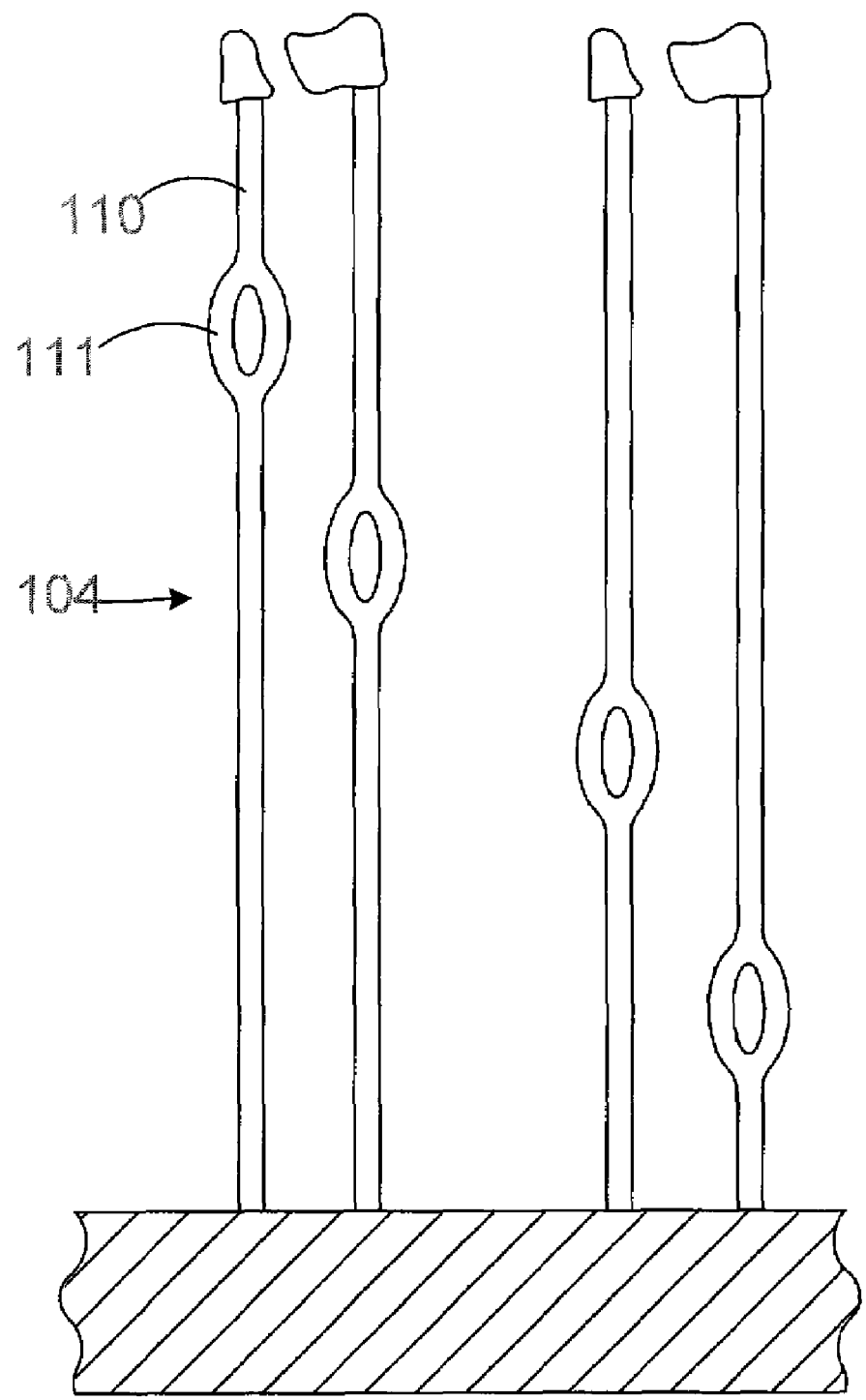
FIGS. 5 to 8 show side elevational views of partially constructed connector leads, in accordance with an example embodiment, showing incrementally how the connector leads of FIG. 1 may be constructed.
Figure 6:
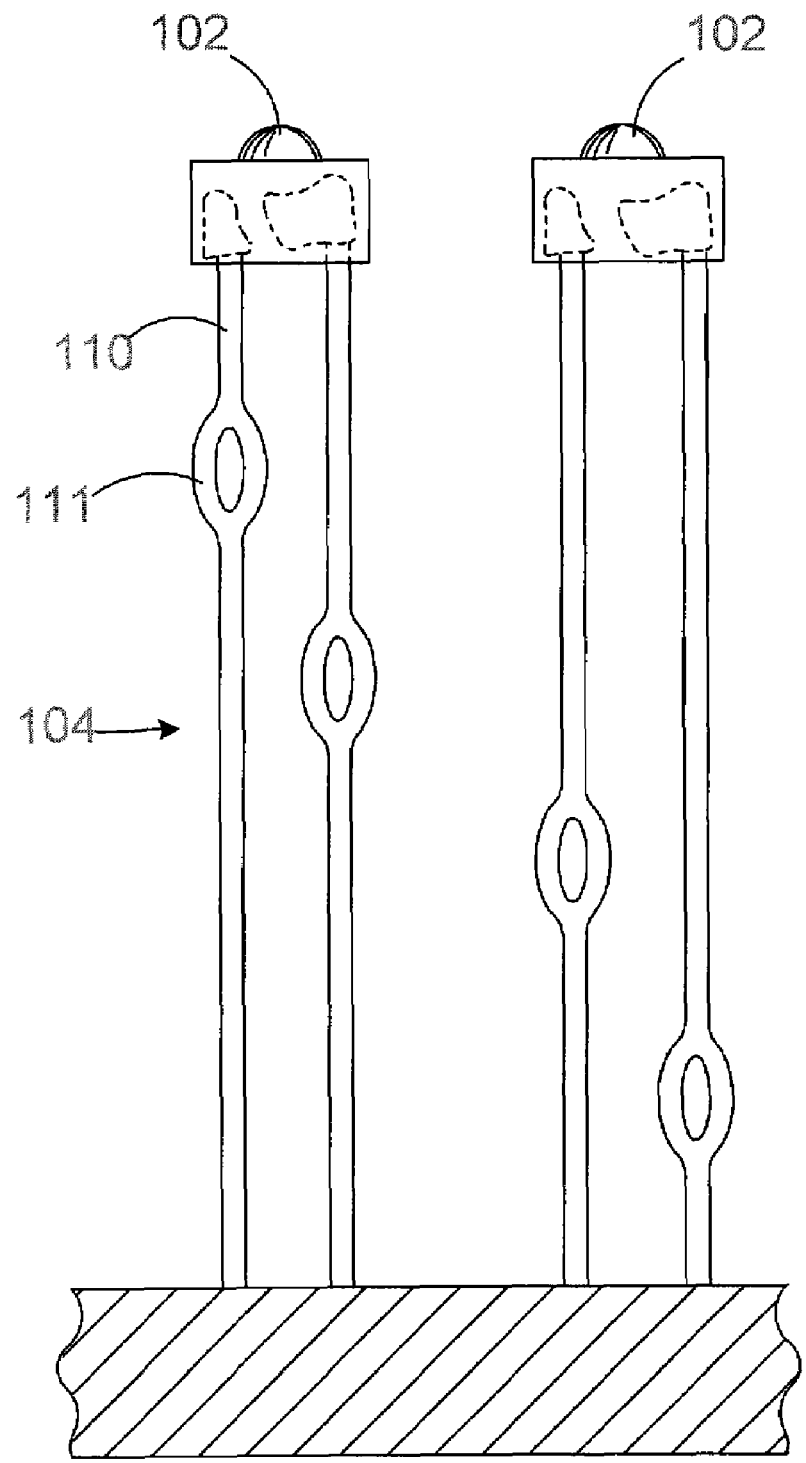

FIGS. 3 and 4 show the electronic component 100 attached to a substrate, for example a PCB 120. The PCB 120 includes a plurality of holes 122 which are aligned with the connection ends 111 of the leads 104. The holes 122 may be electroplated to facilitate an electrical connection with the leads 104.

In accordance with an example embodiment, the connection ends 111 are configured to achieve a frictional interference fit (e.g. press fit) with the respective matched holes 122. Thus, the connection ends 111 may have larger respective dimensions or diameters than the respective holes 122. The leads 104 may be of a resiliently compressible material such as a metal, for instance copper or a copper alloy. The connection end 111 of each lead 104 may be enlarged relative to the internal portion 110 and may bulge outwardly. The connection end 111 may further be hollow or have an aperture therethrough to facilitate inward deformation or compression during insertion so that, as in this example embodiment, the connection end 111 is eye- or loop-shaped, particularly resembling the eye of a needle.

In an example embodiment, the connection end 111 may have an unstressed diameter of about 3 mm while the hole may have a diameter of 2 mm. Therefore, the connection end 111 may be compressed radially inwardly, as indicated by arrows 132, during insertion into the hole 122. The connection end 111 may take any shape or configuration that allows radially inward compression of the connection ends 111. In the above example embodiment, diameters of 2 mm and 3 mm are mentioned merely by way of example. It will be appreciated that in other embodiments different diameters or sizes may be provided where the relative diameters or sizes are such the connection end 111 is received within the hole 122 with a friction fit.

Because of its resilient resistance to compression, the connection end 111 may form a frictional interference fit in the hole 122. Due to this press fit, a reliable electrical connection is formed between the electronic component 100 and the walls of the hole 122, while the electronic component 100 is held rigidly in place. Thus, no soldering is required. Furthermore, as the electronic component 100 is not soldered to the PCB 120, it may be removed (e.g., replaced when the electronic component 100 has failed) without any de-soldering being required. Also, as the electronic component 100 is held firmly in place, lateral movement or shifting of the electronic component 100 relative to the PCB 120 is inhibited by the press fit connection.

In an example embodiment, the connection end 111 is shaped and dimensioned and made of a sufficiently rigid conductive material to withstand an axially compressive insertion force during insertion, so that it does not deform undesirably (e.g. by buckling or bending). For instance, the connection end 111 may be sufficiently rigid not to buckle under a compressive insertion force or pressure of at least 10 psi. The leads 104, or least the connection ends 111 thereof, may thus be of a relatively strong metal, e.g. copper or a copper alloy.

It is to be understood that the connection ends 111 of the leads 104 may be shaped and dimensioned to be connected to standard diameter PCB holes 122. Thus, modification of the PCB 120 may not necessarily be needed and the electronic component 100 may simply be slotted into existing PCBs.

FIGS. 5 to 8 illustrate graphically an example of how the electronic component 100 of FIG. 1 may be constructed. Unless otherwise indicated, like numerals in FIGS. 1 to 4 and FIGS. 5 to 8 refer to the same or similar parts. The leads 104 are formed (e.g. stamped) to include at successive heights along their respective lengths a resiliently deformable formation, in this example a loop- or eye-shaped formation, which ultimately will define the connection end 111 of the lead 104 (see FIG. 5). The LEDs 102 are then attached to the internal portion 110 of the leads 104 (see FIG. 6).

Figure 7:
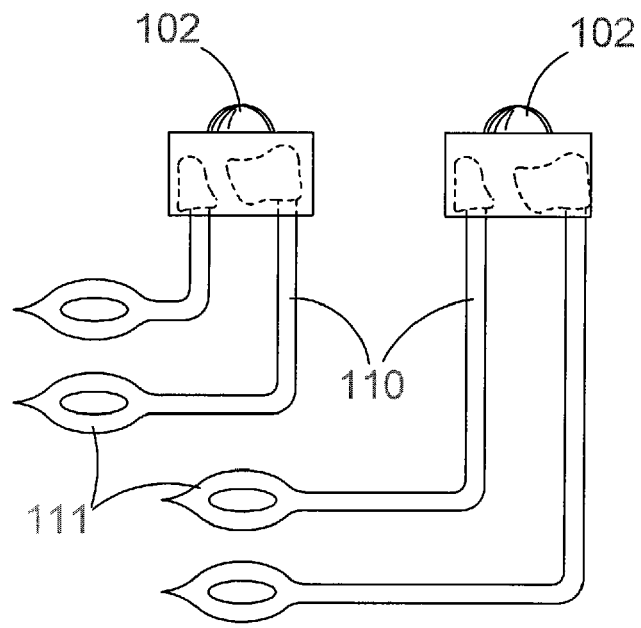
Figure 8:
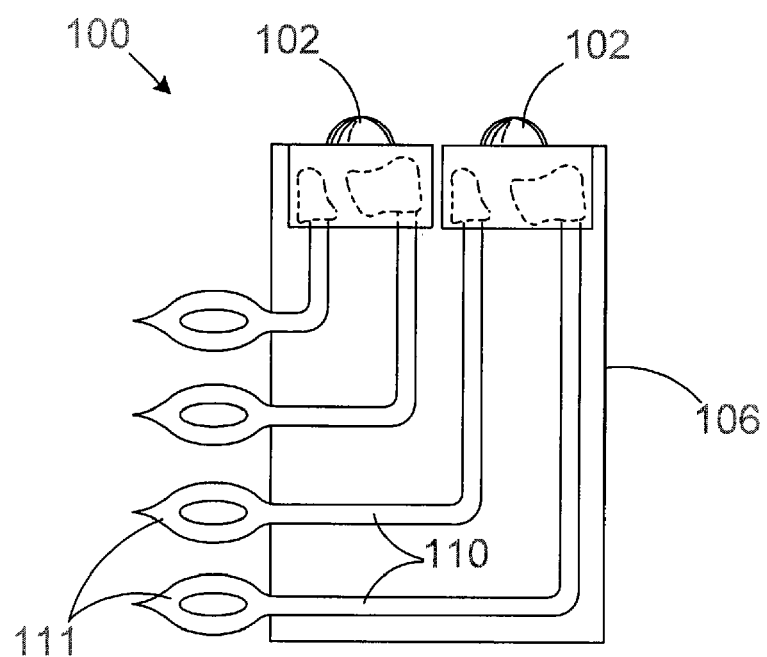

The leads 104 may then be severed or broken immediately below the resiliently deformable connection ends 111 and are bent at right angles roughly halfway along their length (see FIG. 7). A housing 106 (e.g., of a synthetic plastics material) is molded and assembled with, or molded around the LEDs 102 and leads 104 such that the connection ends 111 lie in a plane transverse to a front face of the electronic component 100 which contains the LEDs 102. Thus, the electronic component 100 may therefore be termed a right angled electronic component. As shown in FIG. 8, the connection ends 111 are exposed from the housing 106.

Figure 9:
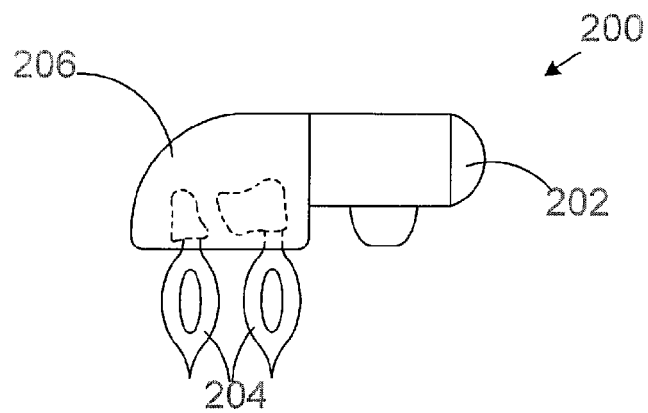
FIG. 9 shows a side-elevational view of an electronic component in accordance with another example embodiment.
Figure 10:
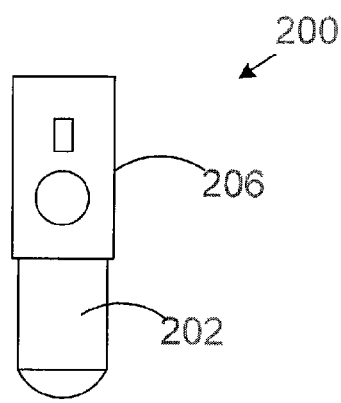
FIG. 10 shows a top-plan view of the electronic component of FIG. 9.
Figure 11:
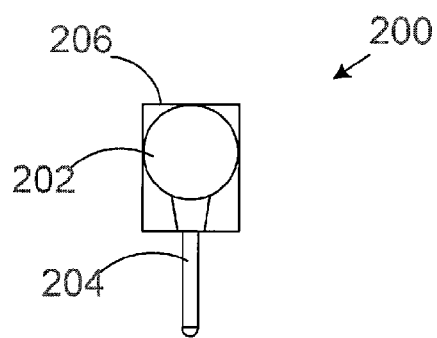
FIG. 11 shows a front-elevational view of the electronic component of FIG. 9.

Referring now to FIGS. 9 to 11, another example embodiment of an electronic component is generally indicated by reference 200. The electronic component 200 comprises a single LED 202 with a corresponding single pair of leads 204 which are shown to include the same example eye-shaped resiliently deformable formation as the electronic component 100. The electronic component 200 is shown to include a housing 206 from which the LED 202 stands proud. The electronic components 100, 200 may be configured to match holes in existing PCBs.

The electronic components 100, 200 in accordance with example embodiments, may have a number of advantages over electronic components in accordance with the prior art.

For example, electronic components in accordance with the prior art generally have leads configured for soldering (e.g. wave soldering) so as to make electrical contact with, and be rigidly mounted to, the PCB. For instance, the leads (in accordance with the prior art) fit into holes with clearance thus providing a non-rigid or "rattle fit". Therefore mere insertion of the lead into the hole does not create a reliable electrical connection nor rigidly mount the electronic component to the PCB. The lead relies on soldering to create the electrical connection and to hold the lead, and thus component, in rigidly in place.

A disadvantage of this approach may be that once soldered, the electronic components are not easily removable. A further disadvantage may be that because the leads fit into the hole with clearance, they tend to move or shift during the soldering process and can potentially become misaligned with apertures into which they are intended to be received.

In addition, the leads in accordance with the prior art typically have a relatively small diameter so that they are not received within the holes with a friction fit. The leads are also of a malleable material and thus buckle or bend when resistance to insertion is encountered. Thus, the leads are typically not configured to withstand an axially compressive force or pressure experienced during frictional insertion. However, the leads 104, 204 in accordance with example embodiments described herein may have a greater diameter to length ratio and/or be of a stronger material so that they can withstand a higher load (or axial compression) without buckling (e.g. as determined by Euler's formula).

The electronic components 100, 200 in accordance with example embodiments provide leads 104, 204 which are configured to deform inwardly upon insertion into a hole 122 but do not buckle or break. As the leads 104, 204 (particularly the connection ends 111) are resilient, they exert an outward force against the hole walls thereby retaining the electronic component 100, 200 in position and forming a reliable electrical connection between the LEDs 102 and the PCB 120. Furthermore, the electronic components 100, 200 are removable and insertable by hand and no soldering or de-soldering is required. This may be advantageous because defective electronic components can easily be replaced and/or electronic components having LEDs of different colors can be arranged as desired. In fact, because the sole purpose of wave soldering is often for attaching LEDs to PCBs in accordance with the prior art, use of the electronic component 100, 200 in accordance with an example embodiment may remove an entire step in the production of a PCB, thereby reducing production costs. In an example embodiment, a completely manufactured electronic device including the electronic components 100, 200 has no solder mounting the components 100, 200 to a PCB.

Also, the leads 104, 204 may be self-aligning. Therefore the LEDs 102, 202 may always fit ideally into the apertures for which they are configured.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims.

In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A press fit electronic component comprising:
a housing;
at least one light emitter; and
at least two connection leads connected to the light emitter, each connection lead comprising an internal portion located within the housing and connected to the light emitter, and an exposed connection end exposed from the housing for connection to a printed circuit board (PCB), the exposed connection end being configured to form a frictional fit with a corresponding hole in the PCB and be sufficiently rigid to withstand a compressive insertion force into the hole.

2. The press fit electronic component as claimed in claim 1, wherein the light emitter comprises a light emitting diode (LED).

3. The press fit electronic component as claimed in claim 1, wherein the exposed connection end is sufficiently rigid to withstand an insertion force of at least 10 psi.

4. The press fit electronic component as claimed in claim 1, wherein the connection lead comprises copper or a copper alloy.

5. The press fit electronic component as claimed in claim 1, wherein the exposed connection end and the light emitter are orientated transversely to each other to define a right angled electronic component.

6. The press fit electronic component as claimed in claim 1, wherein the housing is molded from a synthetic plastics material.

7. The press fit electronic component as claimed in claim 1, wherein the connection lead comprises a connection end defining a resiliently deformable formation.

8. The press fit electronic component as claimed in claim 7, wherein the deformable formation is eye-shaped or loop-shaped.

9. The press fit electronic component as claimed in claim 7, wherein the deformable formation has a cross-sectional dimension of 3 mm.

10. The press fit electronic component as claimed in claim 1, wherein each connection lead has a connection end shaped and dimensioned to be received with a 2 mm hole in the PCB.

11. An electronic device comprising:
a printed circuit board (PCB) including a plurality of holes; and
at least one press fit electronic component comprising:
a housing;
at least one light emitter; and
a connection lead connected to the light emitter, the connection lead comprising an internal portion located within the housing and connected to the light emitter, and an exposed connection end exposed from the housing for connection to a printed circuit board (PCB), the exposed connection end being configured to form a frictional fit with a corresponding hole in the PCB and be sufficiently rigid to withstand a compressive insertion force into the hole.

12. An electronic device comprising:
a printed circuit board (PCB) including a plurality of holes; and
at least one press fit electronic component comprising:
a housing;
at least one light emitter; and
at least two connection leads connected to the light emitter, each connection lead including an internal portion located within the housing and connected to the light emitter, and an exposed connection end exposed from the housing for connection to the PCB, the exposed connection end received within one of the plurality of holes with an interference fit to rigidly mount the electronic component to the PCB and make an electrical connection with the PCB without soldering.

13. The electronic device as claimed claim 12, wherein the electronic device has been completely manufactured.

14. The electronic device as claimed in claim 12, wherein the light emitter comprises a light emitting diode (LED).

15. The electronic device as claimed in claim 12, wherein the exposed connection end has a cross-sectional diameter of 3 mm and the one hole in which the exposed connection end is received has a diameter of 2 mm.

16. The electronic device as claimed in claim 12, wherein the exposed connection end is sufficiently rigid to withstand an insertion force of at least 10 psi.

17. The electronic device as claimed in claim 12, wherein the exposed connection end is defined by a bulbous portion with a cross-sectional diameter of 3 mm.

18. A press fit electronic component comprising:
a housing;
means for emitting light; and
at least two connection means connected to the means for emitting light, each connection means comprising an internal portion located within the housing and connected to the means for emitting light, and an exposed connection end exposed from the housing for connection to a printed circuit board (PCB), the exposed connection end being configured to form a frictional fit with a corresponding hole in the PCB and be sufficiently rigid to withstand a compressive insertion force into the hole.

19. A press fit electronic component comprising:
a housing;
at least one light emitter; and
a connection lead connected to the light emitter, the connection lead comprising an internal portion located within the housing and connected to the light emitter, and an exposed connection end exposed from the housing for connection to a printed circuit board (PCB), the exposed connection end being configured to form a frictional fit with a corresponding hole in the PCB and be sufficiently rigid to withstand a compressive insertion force into the hole.

* * * * *